(12) United States Patent
Agarwal et al.

(10) Patent No.: US 6,911,371 B2
(45) Date of Patent: Jun. 28, 2005

(54) CAPACITOR FORMING METHODS WITH BARRIER LAYERS TO THRESHOLD VOLTAGE SHIFT INDUCING MATERIAL

(75) Inventors: Vishnu K. Agarwal, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 79 days.

(21) Appl. No.: 09/879,335

(22) Filed: Jun. 11, 2001

(65) Prior Publication Data

US 2002/0004279 A1 Jan. 10, 2002

Related U.S. Application Data

(63) Continuation-in-part of application No. 09/710,546, filed on Nov. 8, 2000, which is a continuation of application No. 08/994,054, filed on Dec. 19, 1997, now Pat. No. 6,165,833.

(51) Int. Cl.$^7$ .............................................. H01L 21/20
(52) U.S. Cl. ...................... 438/396; 438/240; 438/243; 438/253
(58) Field of Search ................................. 438/253–256, 438/393–399, 3, 240, 239, 286, 243–246, 10; 257/306, 311, 8

(56) References Cited

U.S. PATENT DOCUMENTS

| 3,571,914 A | 3/1971 | Lands et al. |
| 4,464,701 A | 8/1984 | Roberts et al. |
| 5,296,734 A | 3/1994 | Satoh |

(Continued)

FOREIGN PATENT DOCUMENTS

| NL | 7611928 | 3/1977 |

OTHER PUBLICATIONS

Kamiyama, Satoshi et al., Ultrathin Tantalum Oxide Capacitor Dielectric Layers Fabricated Using Rapid Thermal Nitridatin Prior to Low Pressure Chemical Vapor Deposition: J. Electrochem. Soc., vol. 140, #6, pp 1618–1625 (Jun. 1993).

Yoshimaru, M., et al., "High Quality Ultra Thin $SiO_3N_4$ Film Selectively Deposited on Poly–Si Electrode by LPCVD with In Situ HF Vapor Cleaning", IEEE, pp. 271–274 (Apr. 1992).

Kamiyama, S., et al., Highly Reliable 2.5 nm $Ta_2O_5$ Capacitor Process Technology for 256 Mbit DRAMs, IEEE, pp. 827–830 (Sep. 1991).

(Continued)

Primary Examiner—Craig A. Thompson
(74) Attorney, Agent, or Firm—Wells St. John P.S.

(57) ABSTRACT

A capacitor forming method can include forming an insulation layer over a substrate and forming a barrier layer to threshold voltage shift inducing material over the substrate. An opening can be formed at least into the insulation layer and a capacitor dielectric layer formed at least within the opening. Threshold voltage inducing material can be provided over the barrier layer but be retarded in movement into an electronic device comprised by the substrate. The dielectric layer can comprise a tantalum oxide and the barrier layer can include a silicon nitride. Providing threshold voltage shift inducing material can include oxide annealing dielectric layer such as with $N_2O$. The barrier layer can be formed over the insulation layer, the insulation layer can be formed over the barrier layer, or the barrier layer can be formed over a first insulation layer with a second insulation layer formed over the barrier layer. Further, the barrier layer can be formed after forming the capacitor electrode or after forming the dielectric layer, for example, by using poor step coverage deposition methods.

64 Claims, 9 Drawing Sheets

U.S. PATENT DOCUMENTS

| | | |
|---|---|---|
| 5,346,844 A | 9/1994 | Cho |
| 5,352,623 A | 10/1994 | Kamiyama |
| 5,405,796 A | 4/1995 | Jones |
| 5,438,012 A | 8/1995 | Kamiyama |
| 5,442,213 A | 8/1995 | Okudaira |
| 5,471,364 A | 11/1995 | Summerfelt et al. |
| 5,488,011 A | 1/1996 | Fiura et al. |
| 5,504,041 A | 4/1996 | Summerfelt |
| 5,597,756 A | 1/1997 | Fazan et al. |
| 5,622,883 A | 4/1997 | Kim |
| 5,654,222 A | 8/1997 | Sandhu et al. |
| 5,663,088 A | 9/1997 | Sandhu et al. |
| 5,714,402 A | 2/1998 | Choi |
| 5,783,462 A * | 7/1998 | Huang .................. 438/17 |
| 5,786,248 A | 7/1998 | Schuegraf |
| 5,843,818 A | 12/1998 | Joo et al. |
| 5,843,830 A | 12/1998 | Graettinger et al. |
| 5,854,107 A | 12/1998 | Park et al. |
| 5,866,453 A * | 2/1999 | Prall .................. 438/253 |
| 5,869,382 A | 2/1999 | Kabota |
| 5,893,980 A | 4/1999 | Cho |
| 5,910,880 A | 6/1999 | DeBoer et al. |
| 5,940,676 A | 8/1999 | Fazan et al. |
| 6,232,168 B1 | 5/2001 | Coursey |
| 6,251,720 B1 * | 6/2001 | Thakur et al. .......... 438/240 |
| 6,300,188 B1 * | 10/2001 | Gonzalez ............. 438/239 |

OTHER PUBLICATIONS

Eimori, T., et al., "A Newly Designed Planar Stacked Capacitor Cell with high Dielectric Constant Film for 256Mbit DRAM", 1993 *IEEE*, pp. 631–634.

Fazan, P.C., et al., "A High–C Capacitor (20.4fF/$\mu m^2$) with Ultrathin CVD–$Ta_2O_5$ Films Deposited on Rugged Poly–Si for High Density DRAMs", 1992 IEEE, pp. 263–266.

Lesaicherre, P–Y, et. al., "A Gbit–Scale DRAM Stacked Capacitor Technology with ECR MOCVD $SrTiO_3$ and RIE Patterned $RuO_2$/TiN Storage Nodes", 1994 IEEE, pp. 831–834.

Yamaguchi, H., et. al., "Structural and Electrical Characterization of $SrTiO_3$ Thin Films Prepared by Metal Organic Chemical Vapor Deposition", Jpn. J. Appl. Phys. vol. 32 (1993), Pt. 1, No. 9B, pp. 4069–4073.

* cited by examiner

CAPACITOR FORMING METHODS WITH BARRIER LAYERS TO THRESHOLD VOLTAGE SHIFT INDUCING MATERIAL

RELATED PATENT DATA

This patent resulted from a continuation-in-part application of U.S. patent application Ser. No. 09/710,546, filed on Nov. 8, 2000 now U.S. Pat. No. 6,593,183 entitled "Semiconductor Processing Method" and naming Kunal R. Parekh and Randhir P. S. Thakur as inventors, which application is a continuation application of U.S. Ser. No. 08/944,054 now U.S. Pat. No. 6,165,833, filed on Dec. 19, 1997, each of which are herein incorporated by reference.

TECHNICAL FIELD

The aspects of the invention relate to capacitor forming methods including forming barrier layers to threshold voltage shift inducing material and capacitor constructions having such barrier layers.

BACKGROUND OF THE INVENTION

Capacitors are common devices used in electronics, such as integrated circuits, and particularly semiconductor-based technologies. One factor to consider when selecting materials and/or structure for a capacitor may be the capacitance per unit area. A high K factor (also known as relative dielectric constant or "κ") dielectric material may assist in enhancing capacitance. In the context of this document, "high K factor" is defined as a K factor higher than that of typical DRAM oxynitride dielectric or at least about 7. $Ta_2O_5$ can be one example of a high K factor dielectric, but is known to degrade performance of electronic devices when used in a capacitor. One example of impacted electronic devices includes a transistor. A shift threshold voltage ($V_t$) may occur as well as changes in drift current ($I_{DS}$), device transconductance parameter for a load transistor ($K_L$), and other device characteristics.

Even though high K dielectrics are desirable in capacitors, $V_t$ shift and other effects on device characteristics can be unacceptable in particular applications. Accordingly, methods of using high K dielectrics without substantially degrading device characteristics are needed.

SUMMARY OF THE INVENTION

In one aspect of the invention, a capacitor forming method includes forming an insulation layer over a substrate, the substrate including an electronic device. A barrier layer to threshold voltage ($V_t$) shift inducing material can be formed over the substrate and an opening can be formed in the insulation layer. A high K capacitor dielectric layer may be formed within the opening and $V_t$ shift inducing material provided over the barrier layer. The barrier layer can retard movement of the $V_t$ shift inducing material into the electronic device. As an example, the barrier layer can include a silicon nitride. The opening can be formed completely through the insulation layer. Also, a congruent opening can be formed through the barrier layer. For example, the dielectric layer can include a tantalum oxide. The providing $V_t$ shift inducing material can include oxide annealing with $N_2O$.

In another aspect of the invention, the barrier layer to $V_t$ shift inducing material can be formed over the insulation layer and the opening can be formed through the barrier layer and into the insulation layer. In yet another aspect of the invention, the barrier layer to $V_t$ shift inducing material can be formed over the substrate and the insulation layer formed over the barrier layer. The opening can be formed into at least the insulation layer. In a further aspect of the invention, a first insulation layer may be formed over the substrate, the barrier layer may be formed over the first insulation layer, and a second insulation layer may be formed over the barrier layer. The opening can be formed into at least the second insulation layer.

According to a still further aspect of the invention, a capacitor forming method includes forming an insulation layer over a substrate, the substrate including an electronic device. An opening having a sidewall can be formed into the insulation layer and a capacitor electrode formed at least within the opening and over the sidewall. After forming the capacitor electrode, a barrier layer to $V_t$ shift inducing material can be formed at least over the insulation layer. A high K capacitor dielectric layer can be formed over the capacitor electrode after forming the barrier layer. $V_t$ shift inducing material can be provided over the barrier layer which retards movement of the $V_t$ shift inducing material into the electronic device. Forming the barrier layer can include chemical vapor depositing at a step coverage of less than about 25%. For example, the barrier layer can have a thickness over the sidewall from about 0 to about 300 Angstroms. In another aspect of the invention, the barrier layer to $V_t$ shift inducing material may instead be formed after forming a high K dielectric layer at least over the capacitor electrode.

In a further aspect of the invention, a capacitor construction includes an insulation layer over a substrate, the substrate including an electronic device. A $Si_3N_4$ barrier layer can be over the substrate, retarding movement of $V_t$ shift inducing material into the electronic device. An opening can be at least into the insulation layer and an inner capacitor electrode comprising silicon can be at least within the opening. A high K capacitor dielectric layer can be at least within the opening and over the inner capacitor electrode. An outer capacitor electrode can be over the dielectric layer. In a further aspect, the invention provides a semiconductor die including a capacitor construction described above.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
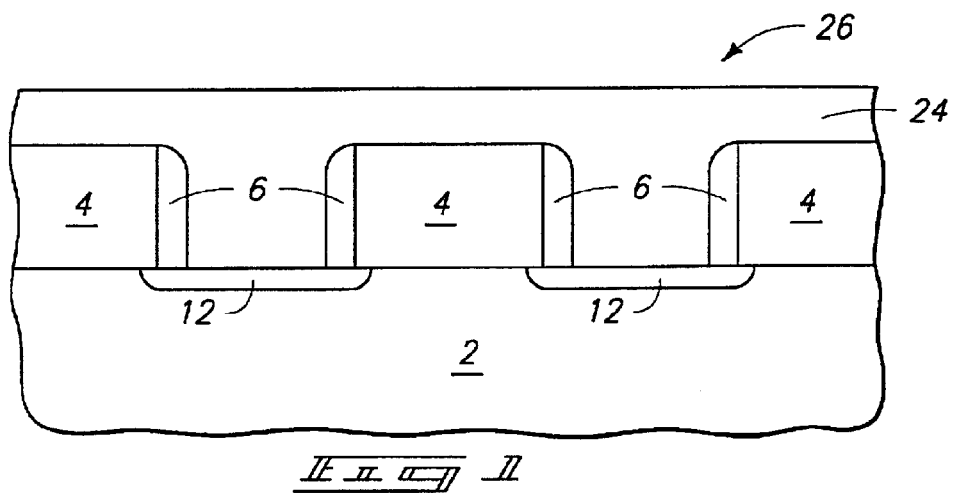
FIG. 1 is an enlarged diagrammatic section view of a semiconductor wafer fragment at one processing step in accordance with an aspect of the invention.

This disclosure of the invention is submitted in furtherance of the constitutional purposes of the U.S. Patent Laws "to promote the progress of science and useful arts" (Article 1, Section 8).

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon) and semiconductive material layers (either alone or in assemblies comprising other materials). The term "substrate" refers to any supporting structure, including, but not limited to, the semiconductive substrates described above.

A variety of contexts arise wherein methods of forming capacitors or other processing methods produce changes in the performance of electronic devices. One example of an electronic device is a transistor. Observation indicates that use of a high K dielectric material in a capacitor forming part of dynamic random access memory (DRAM) can produce a shift in threshold voltage ($V_t$) of associated transistors. Little is known regarding the specific causes of $V_t$ shift or chemical species that contribute to $V_t$ shift. However, observation and trial has produced an indication that barrier layers can be effective in controlling $V_t$ shift.

One possible explanation for the success of barrier layers can be exemplified by reference to use of $Ta_2O_5$ as a capacitor dielectric. Nevertheless, the various aspects of the invention described herein are considered applicable to use of other high K dielectric materials, and other types of semiconductor processes. Examples of suitable capacitor dielectrics include $Al_2O_3$, $HfO_2$, $HfSiO_4$, $ZrO_2$, $ZrSiO_4$, and combinations thereof with or without $Ta_2O_5$. As a capacitor dielectric, $Ta_2O_5$ can potentially exhibit a K factor of at least about 10, for example, as high as 40. However, achieving the theoretical K factor for $Ta_2O_5$ is commonly performed by post-deposition oxide annealing. Such oxide annealing can also be performed as a crystallization anneal to transform $Ta_2O_5$ from an as-deposited amorphous material. Observation indicates that $N_2O$ performs well as an oxidizing species. Oxide annealing is believed to fill oxygen vacancies in as-deposited $Ta_2O_5$. Experience and trial indicate that $N_2O$ appears to work best among a variety of possible oxidizers, and even among other nitrogen-containing oxides. One possible reason, although not verified, is that $N_2O$ is believed to produce active oxygen species, one example being NO—.

While active oxygen species provide benefits in oxide annealing, such materials might also induce a $V_t$ shift. Commonly used insulation materials over electronic devices are often amorphous and can thus be porous to $V_t$ shift inducing materials, for example, active oxygen species and particularly NO—. Diffusion of impurities and other materials, for example, carbon, nitrogen, hydrogen, etc., are also suspects in inducing $V_t$ shift. $V_t$ shift inducing materials can potentially exist in deposited layers rather than as precursor or processing components as in the case of annealing with nitrogen-containing oxides. Nevertheless, the various aspects of the present invention described herein provide protection from $V_t$ shift inducing materials by using barrier layers between electronic devices and a potential source of $V_t$ shift inducing materials. The various aspects of the invention can also prevent changes in other transistor characteristics, such as drift current ($I_{DS}$), device transconductance parameter for a load transistor ($K_L$), etc.

In one aspect of the invention, a capacitor forming method includes forming an insulation layer over a substrate and forming a barrier layer to $V_t$ shift inducing material over the substrate. The substrate can include an electronic device. An opening can be formed at least into the insulation layer and a high K capacitor dielectric layer formed at least within the opening. $V_t$ shift inducing material can be provided over the barrier layer. However, the barrier layer retards movement of the $V_t$ shift inducing material into the electronic device.

The capacitor forming method can be conducted in a variety of ways. For example, the opening can be formed completely through the insulation layer. Also, forming an opening can further include forming a congruent opening through the barrier layer. The barrier layer opening and insulation layer opening can be formed as part of a single etch process or separately. The method can further include forming a capacitor electrode at least within the opening before forming the dielectric layer. Alternatively, the capacitor electrode can be comprised by the underlying substrate. Preferably, the dielectric layer exhibits a K factor of at least about 10. Preferably, the dielectric layer includes a tantalum oxide.

Providing a $V_t$ shift inducing material can also occur in a variety of ways. Providing at least one impurity comprising layer over the barrier layer is one possibility. Another possibility is annealing the dielectric layer. As previously discussed annealing can include oxide annealing. Preferably, annealing includes heating the dielectric to at least about 600° C. in the presence of a nitrogen-containing oxide provided at a partial pressure of at least about 200 milliTorr. More preferably, annealing includes heating to at least about 700° C. at a partial pressure of at least about 400 milliTorr.

A variety of barrier layers having a variety of properties and placed in a variety of positions can accomplish the purposes of the present aspects of the invention. For example, the barrier layer can be formed over the insulation layer, as well as in other positions described below. Such barrier layer can consist essentially of a globally planar barrier layer. That is, the barrier layer can exist essentially in one plane over a particular substrate, semiconductor die, or bulk semiconductor wafer. Understandably, deviations less than the thickness of the barrier layer from perfect planarity can occur while still considering the barrier layer as consisting essentially of a globally planar barrier layer.

Preferably, barrier layers act as a barrier to active oxygen species, such as oxygen radicals, oxygen, etc. as well as other $V_t$ shift inducing materials. Barrier layer thickness can vary from about 30 Angstroms to about 800 Angstroms, but preferably from about 50 to about 300 Angstroms. A silicon nitride, such as $Si_3N_4$, can form a suitable barrier layer. Other suitable materials can include a silicon oxynitride, an aluminum oxide, etc. The silicon-containing nitrides are typically considered most suitable, however, aluminum-containing oxides are generally the next most suitable compared to other oxides. A non-conductive barrier layer can be typically preferred, however, a conductive barrier layer might be suitable if in a position so as not to substantially interfere with the function of electronic devices. For example, a conductive barrier layer formed on a conductive component might not effect the operation of such conductive component. Regardless of the position or component materials, barrier layers are advantageously as thin as possible while still providing effective reduction of $V_t$ shift and other forms of electronic device degradation.

A $Si_3N_4$ barrier layer deposited by plasma enhanced chemical vapor deposition can be about 60 Angstroms. If deposited by low pressure chemical vapor deposition, the barrier layer might need more thickness to achieve equal effectiveness since $Si_3N_4$ formed by such method can be less dense than when formed by a plasma enhanced method. Other chemical vapor deposition methods, atomic layer deposition methods and other methods known to those skilled in the art or yet to be developed can be suitable for forming a barrier layer according to the aspects of the invention herein.

Consideration should be given to possible impacts that barrier layers of the present invention may have on other parts of semiconductor processing. Often, alloying processes are used to diffuse hydrogen or other materials through insulation material as a near-final process to occupy dangling bonds in gate oxide and also to prevent $V_t$ shift. Possibly, a barrier layer according to an aspect of the present invention could frustrate alloying in the conventional manner. Accordingly, backside alloying through an opposite side of a bulk semiconductor wafer can be performed in the alternative according to the knowledge of those skilled in the art.

Figure 2:
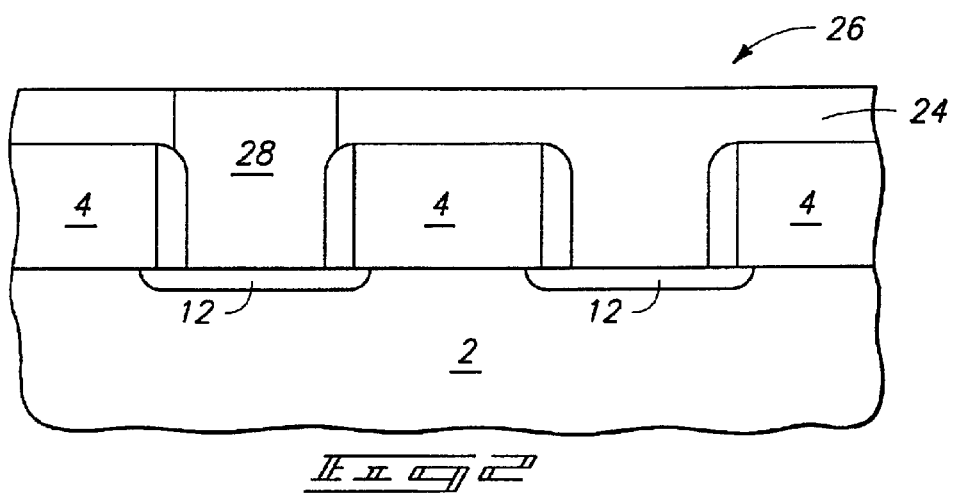
FIG. 2 is a view of the FIG. 1 wafer fragment at a processing step subsequent to that depicted by FIG. 1.
Figure 3:
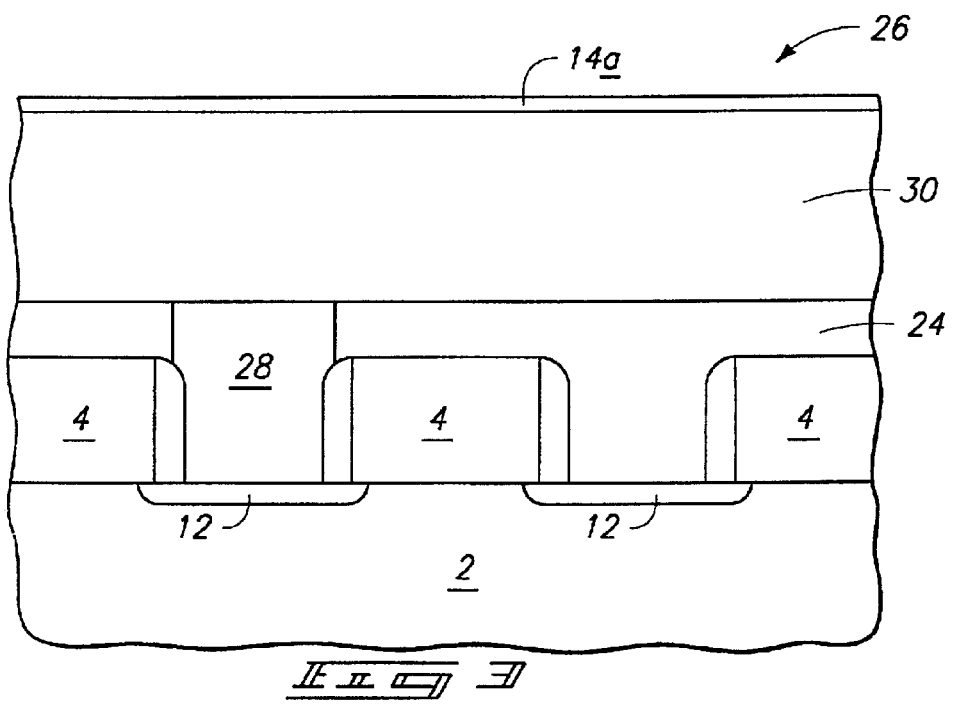
FIG. 3 is a view of the FIG. 2 wafer fragment at a processing step subsequent to that depicted by FIG. 2.

Turning to FIG. 1, a wafer construction 26 is shown at a preliminary process step including a semiconductor substrate 2 having wordlines 4 formed thereon. Spacers 6 are formed on sidewalls of wordlines 4. Diffusion regions 12 are formed in semiconductor substrate 2 and insulation layer 24 is formed over wordlines 4, spacer 6, diffusion regions 12, and semiconductor substrate 2. Wafer construction 26 can be further processed as shown in FIG. 2 by forming an opening through insulation layer 24 to one of diffusion regions 12 and forming contact 28 in the opening. Contact 28 can include a doped polysilicon plug, as well as other materials and structures. Wafer construction 26 can be further processed as shown in FIG. 3 by forming insulation layer 30 on the structure shown in FIG. 2 and forming a $V_t$ shift barrier layer 14a on insulation layer 30.

Figure 4:
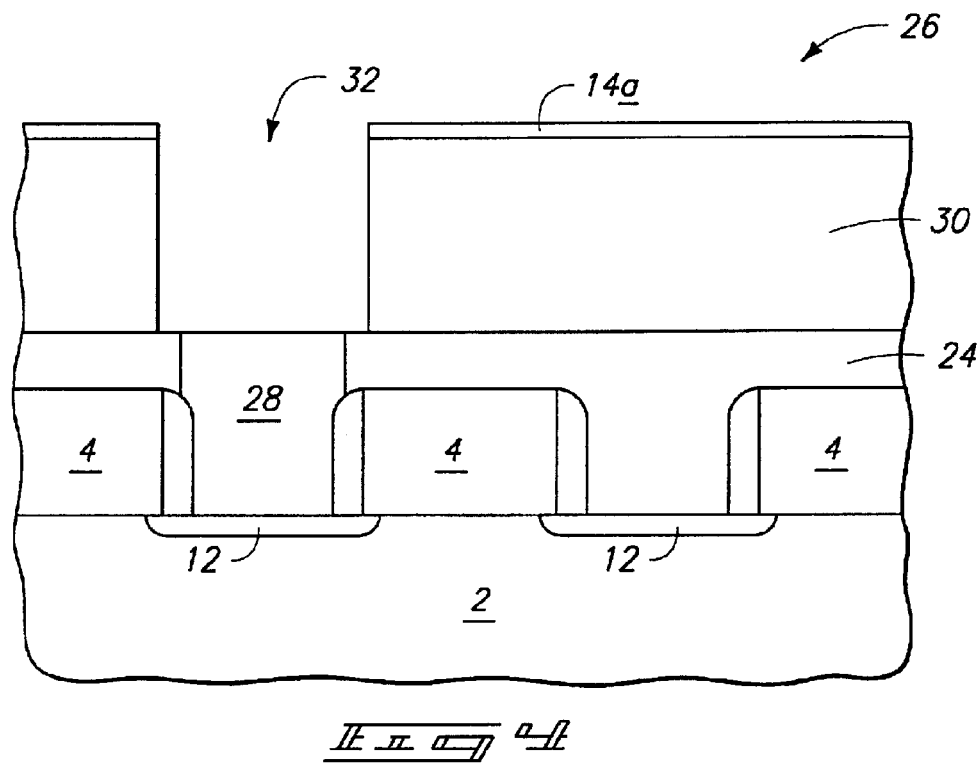
FIG. 4 is a view of the FIG. 3 wafer fragment at a processing step subsequent to that depicted by FIG. 3.
Figure 5:
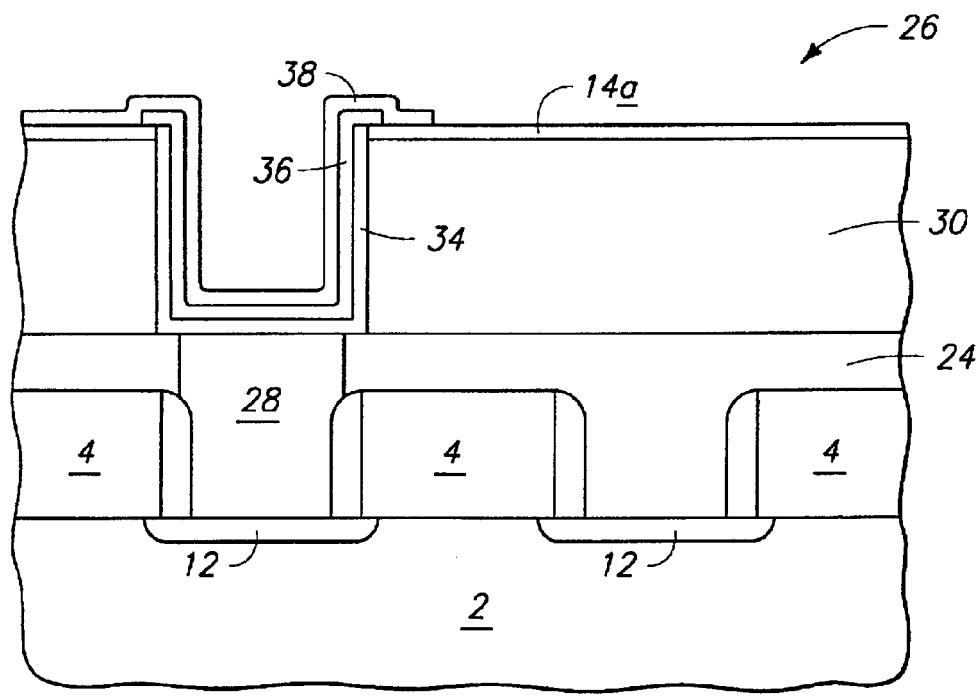
FIG. 5 is a view of the FIG. 4 wafer fragment at a processing step subsequent to that depicted by FIG. 4.

FIG. 4 shows forming an opening 32 completely through barrier layer 14a and insulation layer 30 to contact 28 and insulation layer 24. Further processing can produce wafer construction 26 as shown in FIG. 5 by forming an electrode 34 in opening 32, forming a dielectric layer 36 on electrode 34 and forming an electrode 38 on dielectric layer 36. As seen from FIG. 5, barrier layer 14a can reduce movement of $V_t$ shift inducing material from over barrier layer 14a into wordlines 4, diffusion regions 12, and semiconductor substrate 2. Because opening 32 is formed through barrier layer 14a, $V_t$ shift inducing materials could potentially pass under barrier layer 14a through opening 32. However, the materials forming electrodes 34, 38 and dielectric layer 36, as well as other alternative capacitor structures not shown, can also retard movement of $V_t$ shift inducing material. As an example, electrode 34 can be formed from polysilicon, such as rough polysilicon, which will react with active oxygen species to form silicon oxides. Accordingly, diffusion of active oxygen species provided during oxygen annealing of dielectric layer 36 can be reduced with electrode 34. A variety of methods known to those skilled in the art or yet to be developed can be used to prevent oxidation of electrode 34 by oxygen potentially contained in dielectric layer 36. One example is rapid thermal nitridation of a polysilicon electrode to form a silicon nitride layer prior to formation of a dielectric layer. Whether or not such methods are used, the combination of barrier layer 14a and other materials forming part of the capacitor stack, including, but not limited to, electrodes 34, 38 and dielectric 36 can retard movement of $V_t$ shift inducing materials.

According to an aspect of the invention, a capacitor forming method includes forming an insulation layer over a substrate, the substrate including an electronic device. A barrier layer to $V_t$ shift inducing material can be formed over the insulation layer. An opening can be formed through the barrier layer and into the insulation layer. A high K capacitor dielectric layer can be formed at least within the opening. The barrier layer may retard movement of $V_t$ shift inducing material provided over the barrier layer. FIGS. 1–5 provide one example of a barrier layer formed over an insulation layer. The opening in FIG. 4 is formed completely through the insulation layer. The dielectric layer of FIG. 5 is formed within the opening as well as partially outside the opening and elevationally above the insulation layer.

Figure 6:
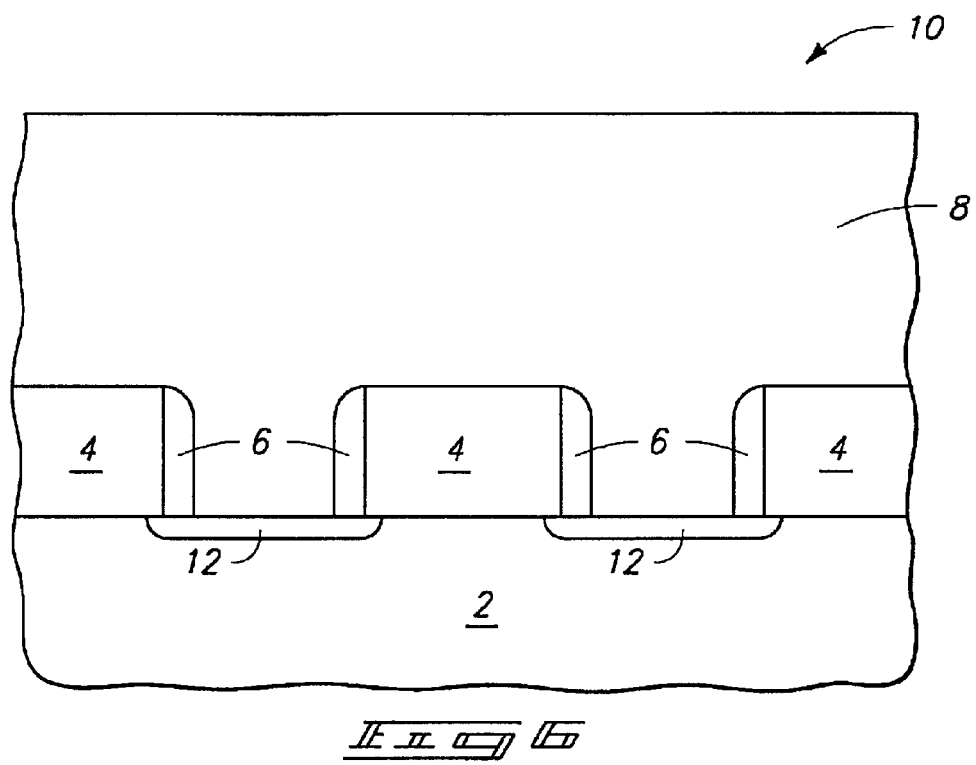
FIG. 6 is an enlarged diagrammatic sectional view of a semiconductor wafer fragment at one processing step in accordance with an alternative aspect of the invention.
Figure 7:
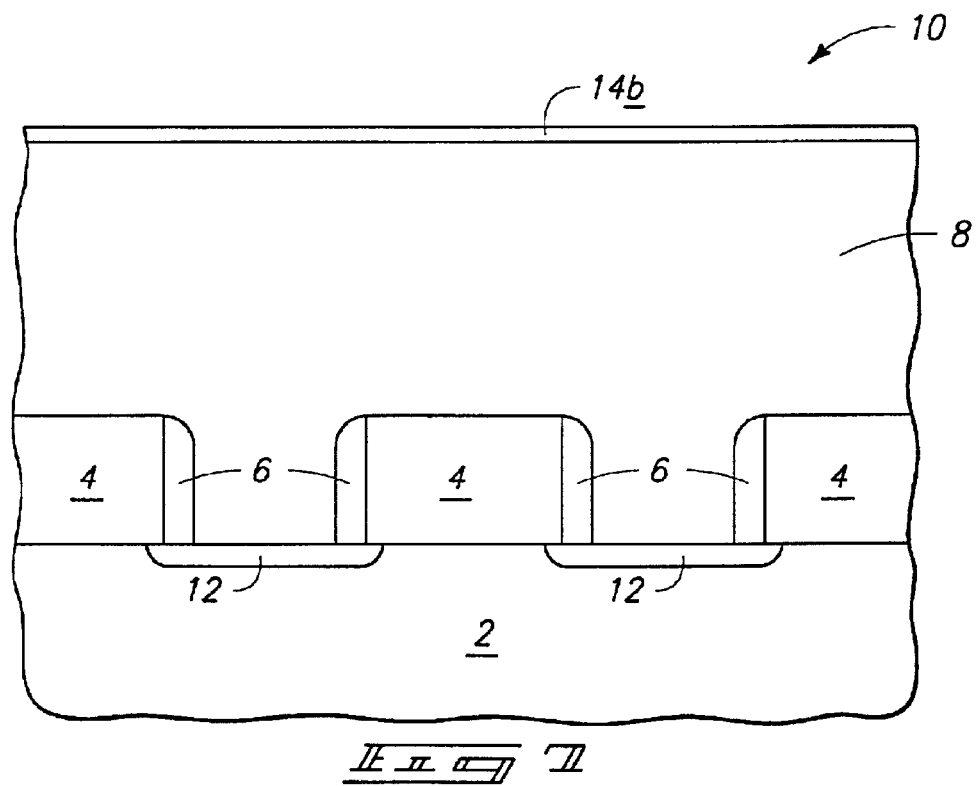
FIG. 7 is a view of the FIG. 6 wafer fragment at a processing step subsequent to that depicted by FIG. 6.
Figure 8:
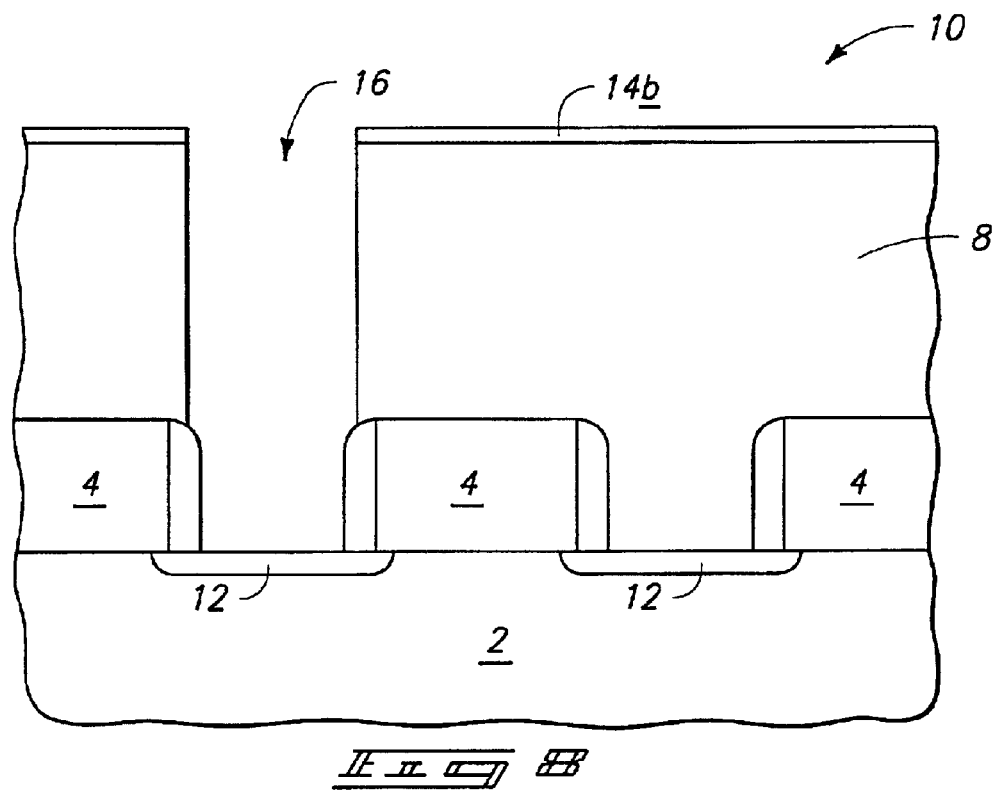
FIG. 8 is a view of the FIG. 7 wafer fragment at a processing step subsequent to that depicted by FIG. 7.
Figure 9:
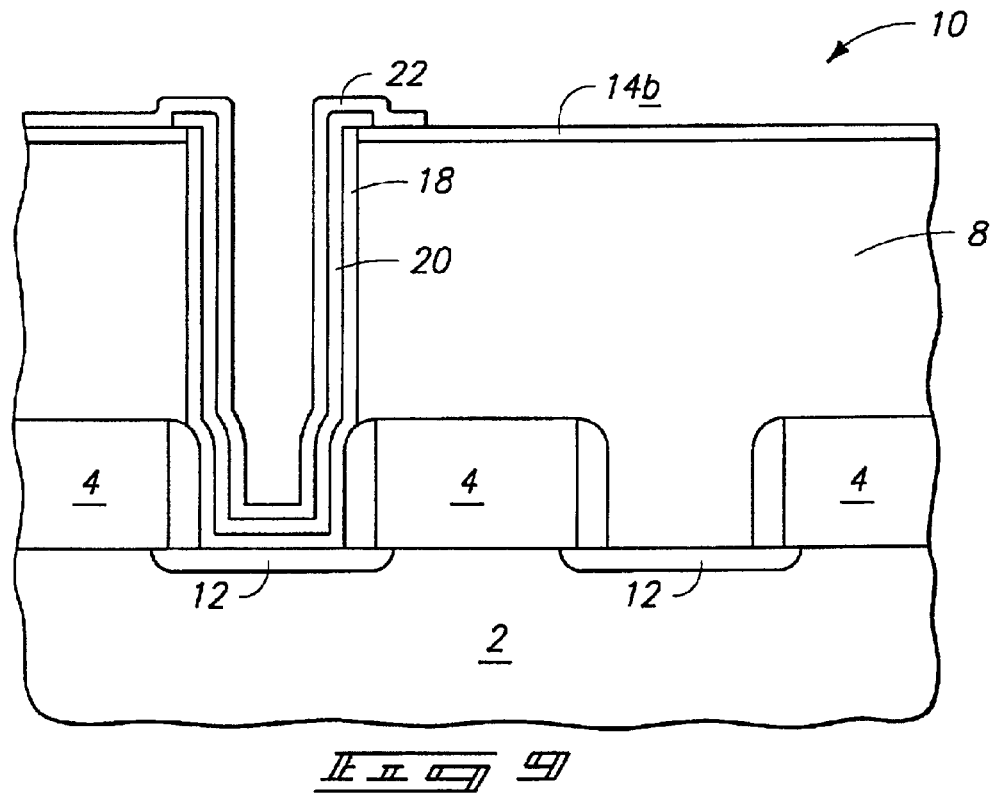
FIG. 9 is a view of the FIG. 8 wafer fragment at a processing step subsequent to that depicted by FIG. 8.

Turning to FIG. 6, a wafer construction 10 at a preliminary process step is shown having an insulation layer 8 formed over wordlines 4, spacers 6, diffusion regions 12, and semiconductor substrate 2 at a greater insulation layer thickness than shown in FIG. 1. However, a similar method to that discussed above regarding FIGS. 1–5 can be used to process wafer construction 10. In FIG. 7, $V_t$ shift barrier layer 14b is formed over insulation layer 8. In FIG. 8, an opening 16 is formed through barrier layer 14b and insulation layer 8 to expose diffusion region 12. Opening 16 is formed completely through insulation layer 8. In FIG. 9, an electrode 18 is formed in opening 16, a dielectric layer 20 is formed on electrode 18, and an electrode 22 is formed on dielectric layer 20.

Comparing wafer construction 10 of FIG. 9 to wafer construction 26 of FIG. 5, insulation layer 8 is seen as continuous from diffusion region 12 to barrier layer 14b and no contact 28 is used to electrically link the capacitor stack to diffusion region 12. Otherwise, barrier layer 14b is positioned in a similar fashion to that shown for barrier layer 14a. In the remaining FIGS. 10–19, an insulation layer structure and capacitor structure analogous to that shown in FIG. 5 is repeated. However, it is conceivable that the alternative insulation layer and capacitor structure of FIG. 9 may be used in the alternative in performing the methods exemplified by FIGS. 10–19.

It can be advantageous to form a $V_t$ shift barrier layer over an insulation layer, such as shown in FIGS. 5 and 9, since the underlying insulation layer can be easily planarized by chemical mechanical polishing (CMP) or another suitable method. Thus, the barrier layer can be formed as a globally planar barrier layer. Formation of a barrier layer of uniform thickness can occur more readily on a planar substrate compared to a nonplanar substrate. Further, formation of a barrier layer of uniform thickness can occur more readily on a substrate of a uniform composition compared to a substrate of varying composition. Accordingly, barrier layers 14a and 14b can be formed at substantially uniform thicknesses as exemplified by FIGS. 3 and 7. The effectiveness of a barrier layer depends in part on its thickness. Accordingly, a uniform thickness can be desirable.

Consideration should be given that barrier layers 14a, 14b may be exposed to CMP as a polish stop layer during removal of excess material used to form electrode 34 of FIG. 5 and to form electrode 18 of FIG. 9. Accordingly, it may be desirable to provide barrier layers 14a, 14b as deposited at a somewhat greater thickness than desired to account for some loss during CMP of other material.

In another aspect of the invention, a capacitor forming method includes forming a barrier layer to $V_t$ shift inducing material over a substrate. An insulation layer can be formed over the barrier layer and an opening can be formed into at least the insulation layer. A high K capacitor dielectric layer can be formed at least within the opening and $V_t$ shift inducing material provided over the barrier layer. The barrier layer retards movement of the $V_t$ shift inducing materials into an electronic device comprised by the substrate.

Figure 10:
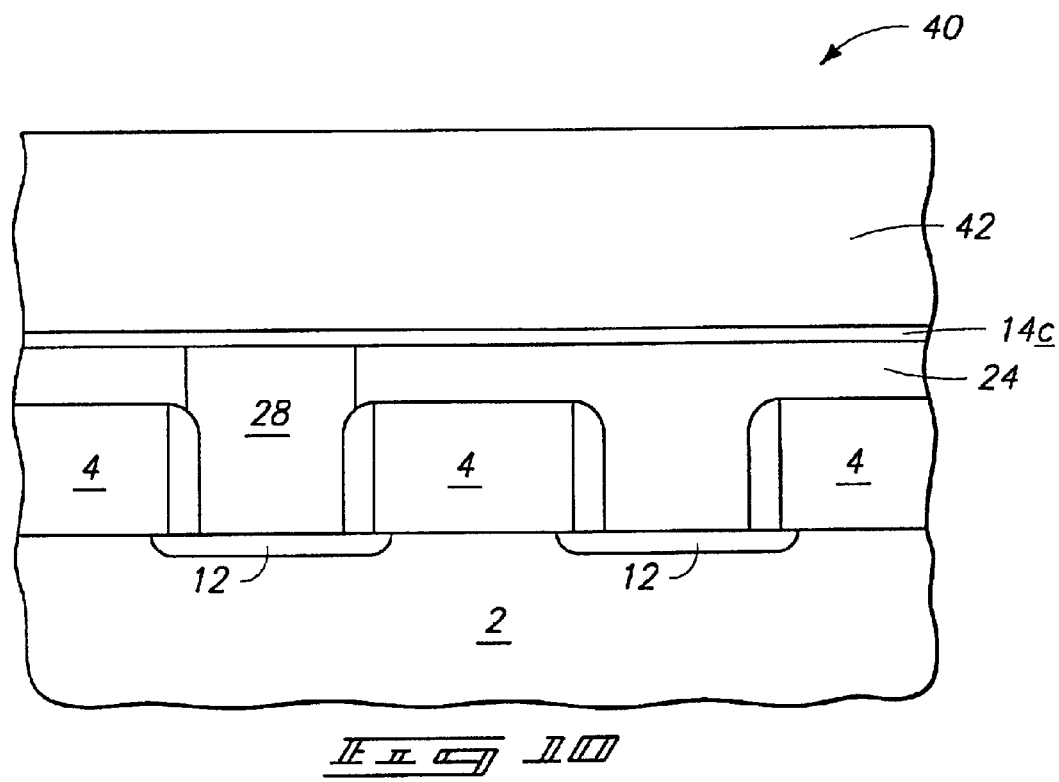
FIG. 10 is an enlarged diagrammatic sectional view of the FIG. 2 semiconductor wafer fragment at a processing step subsequent to that depicted by FIG. 2 in accordance with another alternative aspect of the invention.
Figure 11:
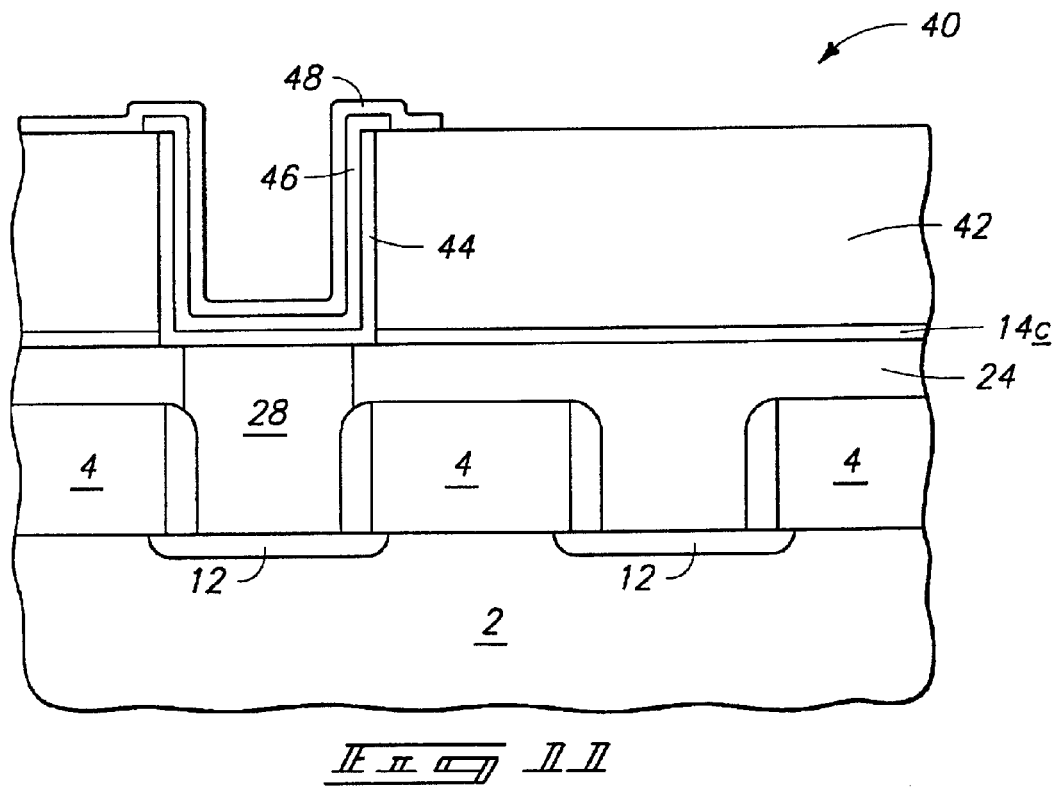
FIG. 11 is a view of the FIG. 10 wafer fragment at a processing step subsequent to that depicted by FIG. 10.

Turning to FIG. 10, a wafer construction 40 is shown including wafer construction 26 of FIG. 2 except that a $V_t$ shift barrier layer 14c is formed over insulation layer 24 and an insulation layer 42 is formed over barrier layer 14c. Notably, although not shown, barrier layer 14c could be formed directly on wordlines 4, spacers 6, and diffusion regions 12 with insulation layer 42 formed on barrier layer 14c, thus eliminating insulation layer 24. FIG. 11 shows wafer construction 40 after forming an opening completely through insulation layer 42 and barrier layer 14c exposing contact 28. An electrode 44, a dielectric layer 46, and an electrode 48 are then formed at least within such opening as shown in FIG. 11.

In a further aspect of the invention, a capacitor forming method includes forming a first insulation layer over a substrate, forming a barrier layer to $V_t$ shift inducing materials over the first insulation layer, and forming a second insulation layer over the barrier layer. An opening can be formed into at least the second insulation layer and a high K capacitor dielectric layer formed at least within the opening. $V_t$ shift inducing material provided over the barrier layer can be thus retarded in movement into an electronic device comprised by the substrate.

Figure 12:
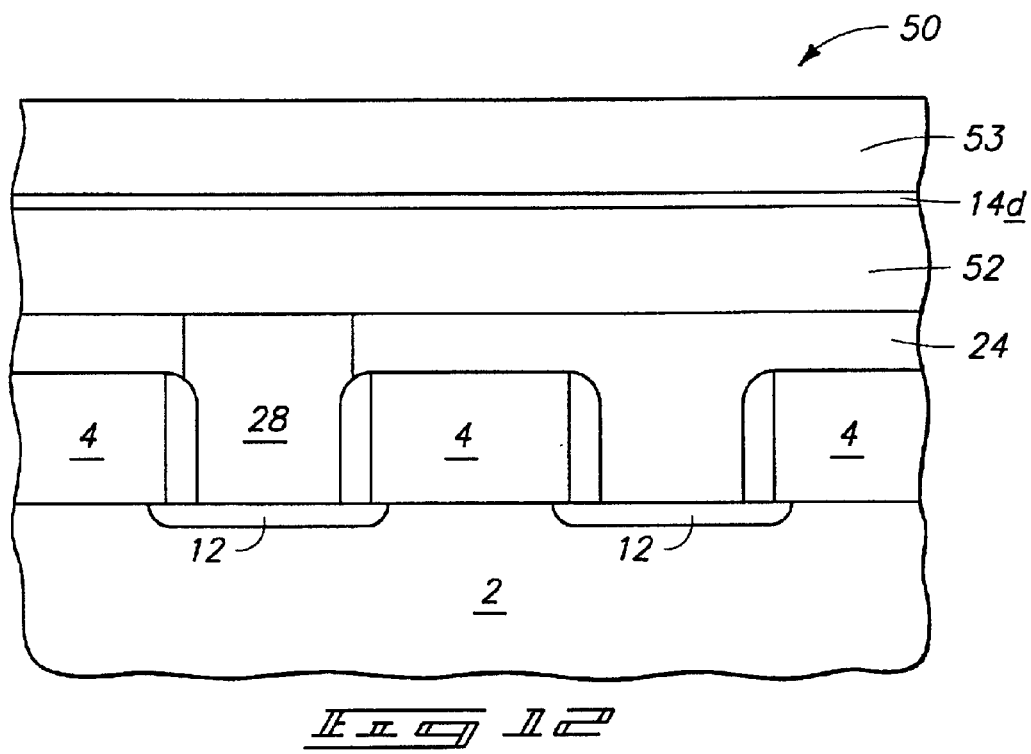
FIG. 12 is an enlarged diagrammatic sectional view of the FIG. 2 semiconductor wafer fragment at a processing step subsequent to that depicted by FIG. 2 in accordance with yet another alternative aspect of the invention.
Figure 13:
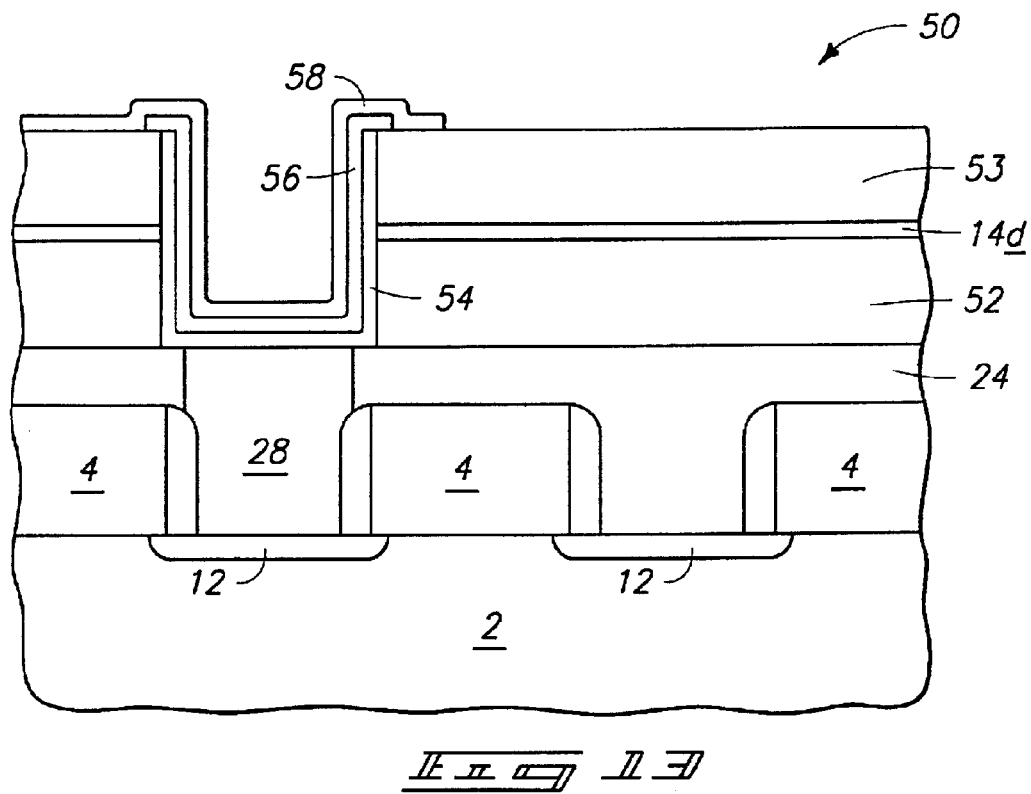
FIG. 13 is a view of the FIG. 12 wafer fragment at a processing step subsequent to that depicted by FIG. 12.

FIG. 12 shows a wafer construction including wafer construction 26 shown in FIG. 2 except that a lower insulation layer 52, a $V_t$ shift barrier layer 14d, and an upper insulation layer 53 are formed over insulation layer 24 as shown in FIG. 12. FIG. 13 shows wafer construction after formation of an opening completely through upper insulation layer 53, barrier layer 14d, and lower insulation layer 52 to expose contact 28. An electrode 54, a dielectric layer 56, and an electrode 58 are shown formed at least within such opening. Notably, lower insulation layer 52 could be formed directly on wordlines 4, spacers 6, and diffusion regions 12 such that separate insulation layer 24 is eliminated.

One potential advantage of wafer construction and wafer construction 40 is that respective barrier layers 14d and 14c would not be exposed to CMP of materials used to form capacitor structures. Accordingly, consideration need not be given to forming barrier layers 14c, 14d at a greater thickness than desired to account for CMP losses.

In a further aspect of the invention, a capacitor forming method includes forming an insulation layer over a substrate and forming an opening into the insulation layer, the opening having a sidewall. A capacitor electrode may be formed at least within the opening and over the sidewall followed by forming a barrier layer to $V_t$ shift inducing material at least over the insulation layer. After forming the barrier layer, a high K capacitor dielectric layer can be formed at least over the capacitor electrode and $V_t$ shift inducing material can be provided over the barrier layer. The barrier layer retards movement of the $V_t$ shift inducing material into an electronic device comprised by the substrate. Because the electrode can be already formed in the above described method, it might be desirable to form the barrier layer over the insulation layer while avoiding formation of the barrier layer over the capacitor electrode or removing the barrier layer from the capacitor electrode when formed thereon. To avoid a need for etch removal of the barrier from over the capacitor electrode, a deposition method with intentionally poor step coverage can be used in forming the barrier layer. As an example, the forming the barrier layer can include chemical vapor depositing (CVD) at a step coverage of less than about 25%. Preferably, step coverage is less than about 10%. Also, the barrier layer can have a thickness over the sidewall from about 0 to about 300 Angstroms.

Figure 14:
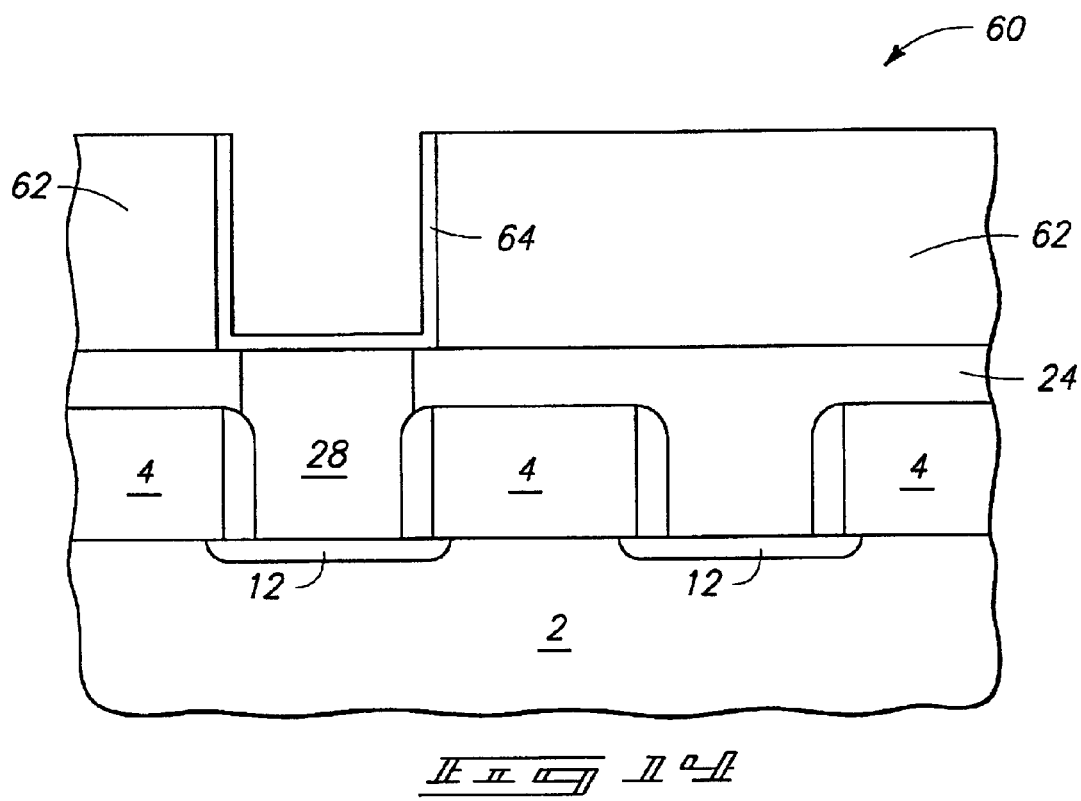
FIG. 14 is an enlarged diagrammatic sectional view of the FIG. 2 semiconductor wafer fragment at a processing step subsequent to that depicted by FIG. 2 in accordance with a further alternative aspect of the invention.
Figure 15:
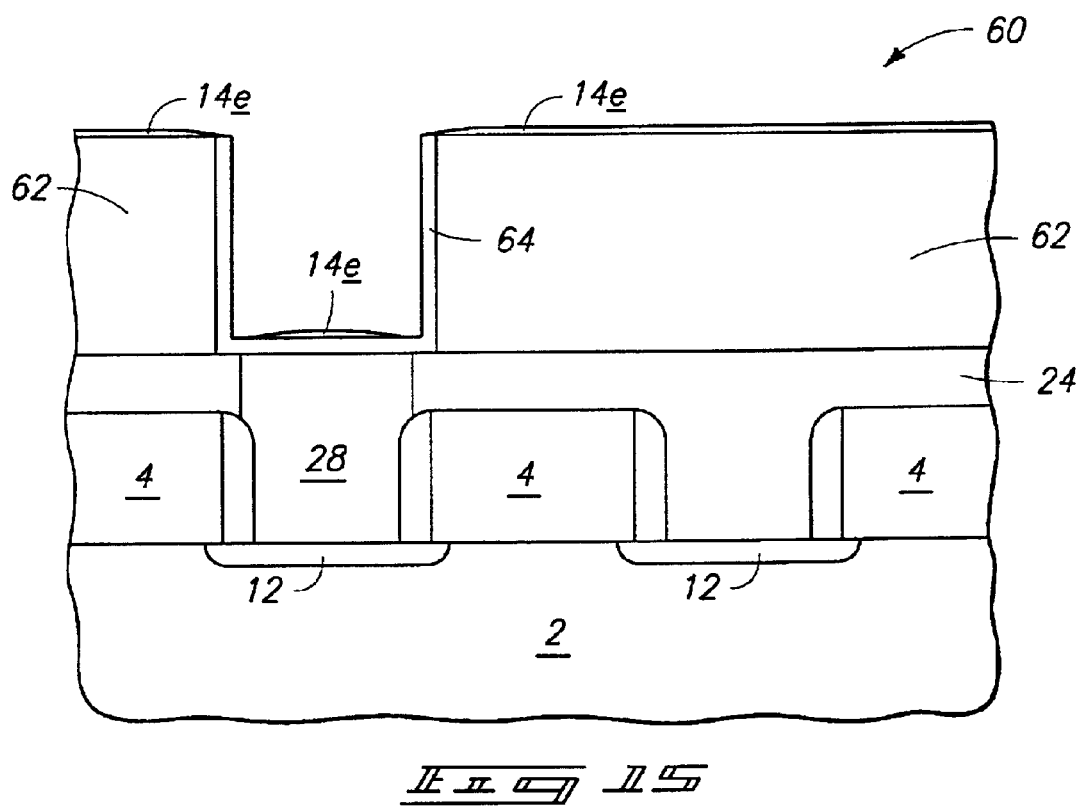
FIG. 15 is a view of the FIG. 14 wafer fragment at a processing step subsequent to that depicted by FIG. 14.

In FIG. 14, wafer construction 60 includes wafer construction 26 shown in FIG. 2 except that an insulation layer 62 is formed on insulation layer 24, an opening is formed completely through insulation layer 62, and a capacitor electrode 64 is formed entirely within the opening. In FIG. 15, a barrier layer 14e is formed over insulation layer 62 as well as over parts of electrode 64. Such a structure can result from a deposition process wherein step coverage is intentionally poor. Accordingly, little or no barrier layer forms over the sidewalls of electrode 64. Depending on the processing conditions and the aspect ratio of capacitor electrode 64, little or no barrier layer 14e may form at the bottom of the electrode 64. For high aspect ratio openings, step coverage can be poor enough that essentially barrier layer 14e forms at the bottom of electrode 64. At lower aspect ratios, it is more likely that a small amount of barrier layer 14e might form at the bottom as shown in FIG. 15.

Figure 16:
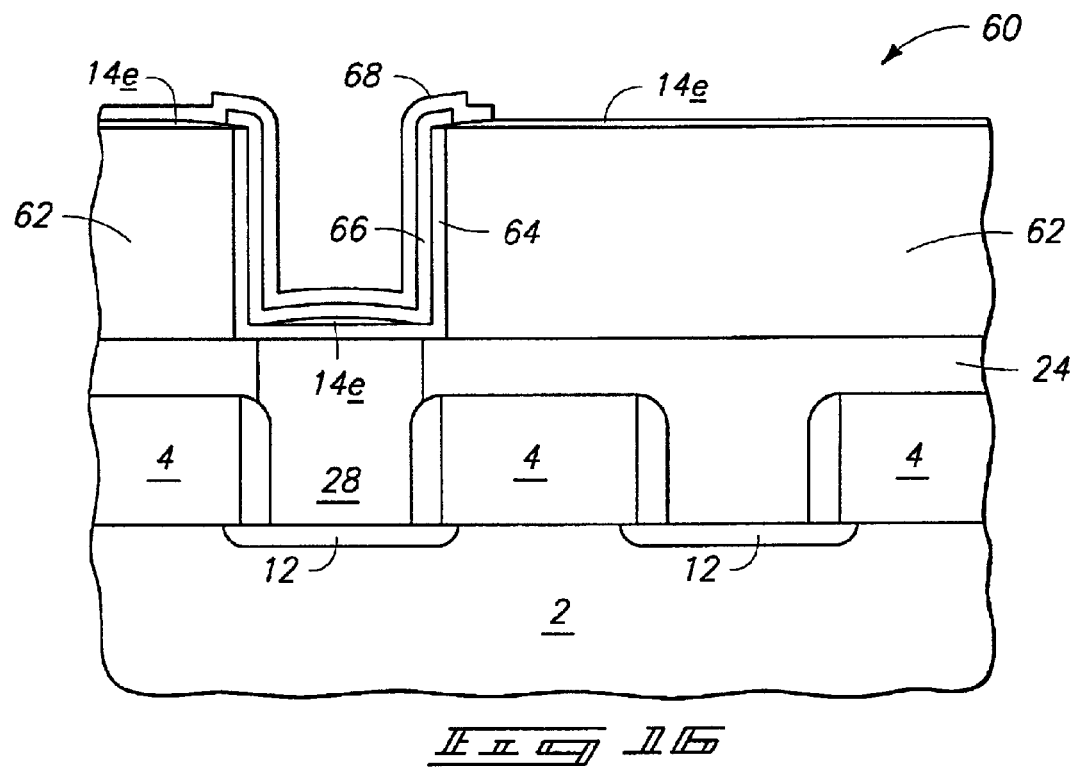
FIG. 16 is a view of the FIG. 15 wafer fragment at a processing step subsequent to that depicted by FIG. 15.

FIG. 16 shows a dielectric layer 66 and an electrode 68 formed over electrode 64 as well as over part of insulation layer 62 and barrier layer 14e. Depending on the material selected for barrier layer 14e, the portion of barrier layer 14e formed at the bottom of electrode 64 can produce area loss in the resulting capacitor. However, the area loss can be small, depending on the step coverage. Also, such area loss may be acceptable given the improvement in reducing $V_t$ shift inducing material, $I_{DS}$ shift, $K_L$ shift, etc. As indicated, barrier layer 14e is formed after electrode 64 but before dielectric 66. Accordingly barrier layer 14e can retard movement of $V_t$ shift inducing materials present during annealing of dielectric layer 66 as well as impurities in material formed over barrier layer 14e.

In a still further aspect of the invention, a capacitor forming method includes forming an insulation layer over a substrate and forming an opening in the insulation layer, the opening having a sidewall. A capacitor electrode can be formed at least within the opening and over the sidewall and a high K capacitor dielectric layer can be formed at least over the capacitor electrode. After forming the dielectric layer, a barrier layer to $V_t$ shift inducing material can be formed over the insulation layer and retard movement of $V_t$ shift inducing material provided over the barrier layer. As described above, step coverage can be less than about 25% and the barrier layer thickness over the sidewall can be from about 0 to about 300 Angstroms. Also, the barrier layer can be formed before annealing the dielectric layer even though the barrier layer can be formed after forming the capacitor dielectric layer. In this manner, the barrier layer can retard movement of $V_t$ shift inducing material provided during annealing. The barrier layer can be formed after annealing, but might be less advantageous.

Figure 17:
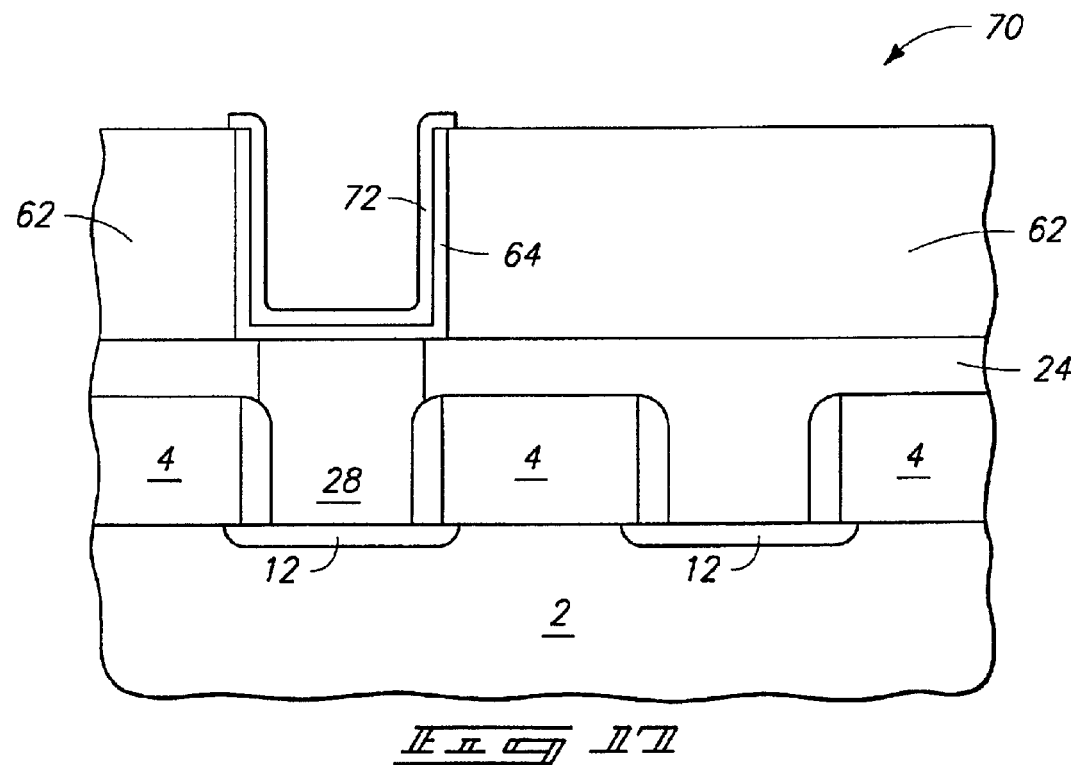
FIG. 17 is an enlarged diagrammatic sectional view of the FIG. 2 semiconductor wafer fragment at a processing step subsequent to that depicted by FIG. 2 in accordance with a still further alternative aspect of the invention.
Figure 18:
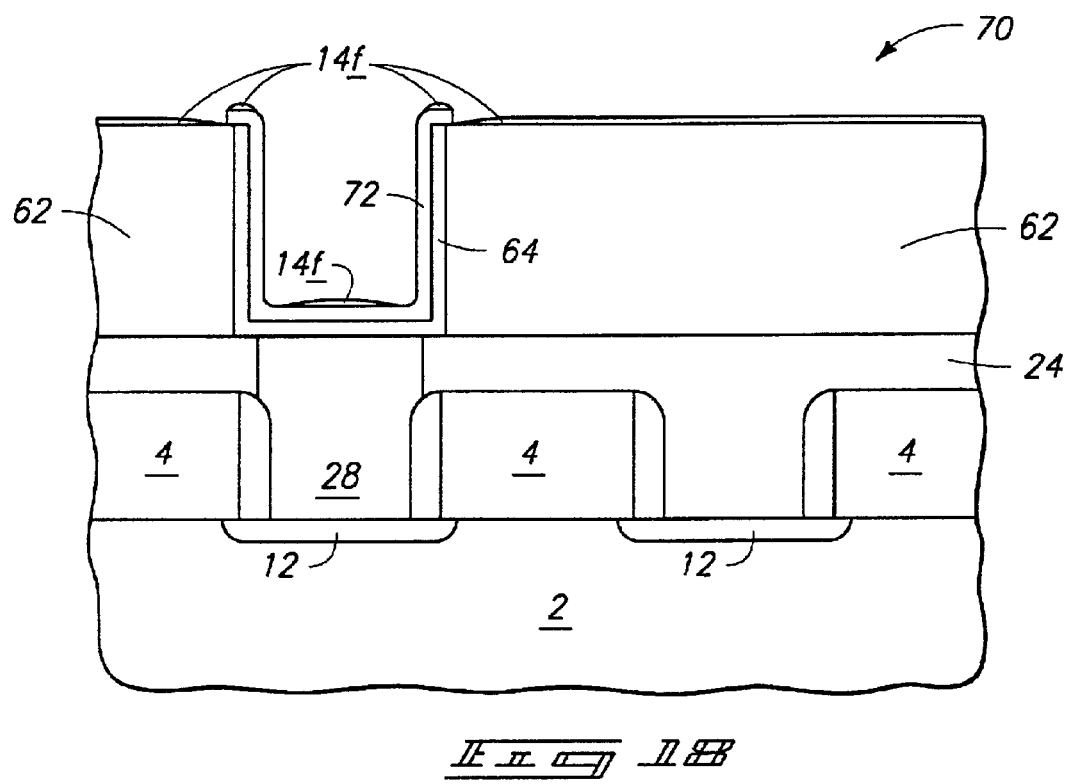
FIG. 18 is a view of the FIG. 17 wafer fragment at a processing step subsequent to that depicted by FIG. 17.
Figure 19:
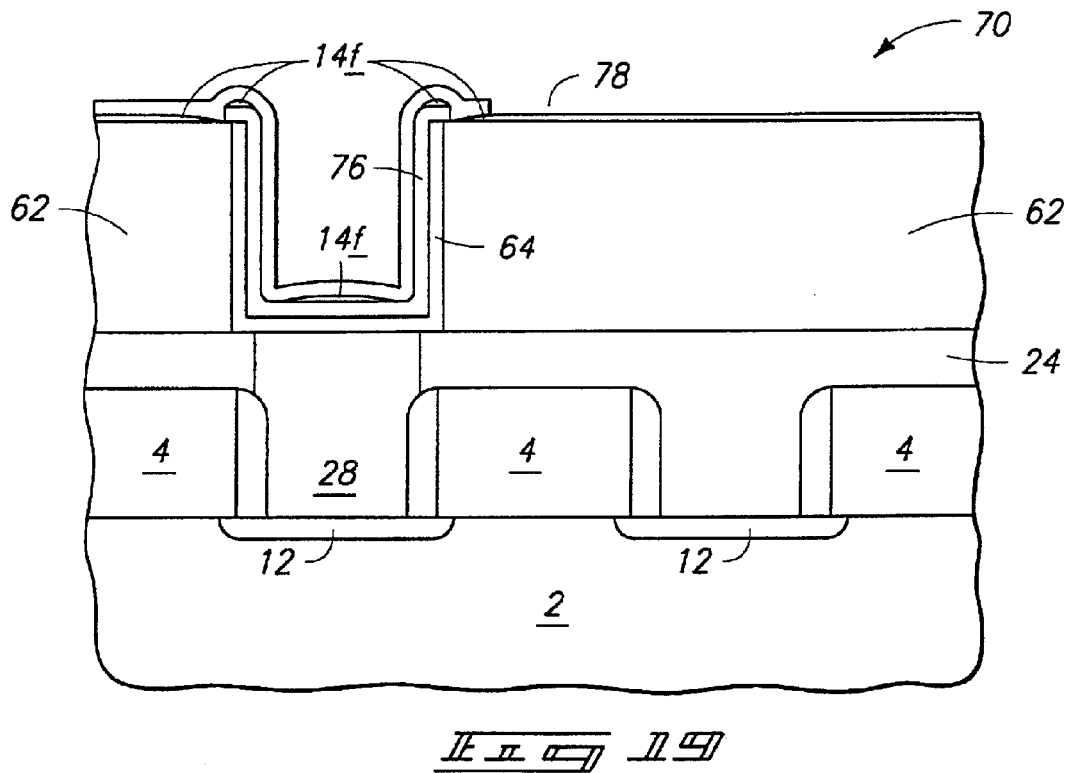
FIG. 19 is a view of the FIG. 18 wafer fragment at a processing step subsequent to that depicted by FIG. 18.

In FIG. 17, wafer construction 70 includes wafer construction 26 shown in FIG. 2 except that an insulation layer 62 is formed over insulation layer 64. Also, an opening is formed completely through insulation layer 62 and an electrode 64 is formed completely within the opening. Further, a dielectric layer 72 is formed on electrode 64 as well as over a part of insulation layer 62. FIG. 18 shows a barrier layer 14f formed over insulation layer 62 as well as over part of dielectric layer 72 but not over the sidewall of dielectric layer 72. In FIG. 19, an electrode 78 is formed over dielectric layer 76 as well as over part of insulation layer 62 and barrier layer 14f.

A variety of deposition methods are suitable for forming a barrier layer in the various aspects of the invention. When forming a silicon nitride containing a barrier layer, plasma enhanced CVD (PECVD) with silane/ammonia or dichlorosilane/ammonia reactant pairs may be suitable. If poor step coverage is desired, the amount of the silicon source (dichlorosilane, silane, etc) can be reduced and/or the bias setting for the plasma can be increased. Increasing the bias can make the deposition more directional. Low pressure CVD (LPCVD) can also be used to form a silicon nitride containing barrier layer using silane/ammonia, dichlorosilane/ammonia, or TCS (trichlorosilane, tetrachlorosilane, or both)/ammonia reactant pairs.

In forming barrier layers, it is generally desired to reduce stress in the barrier layers and to reduce the prevalence of pinholes. For silicon nitride containing barrier layers, annealing in the presence of ammonia, nitrogen, hydrogen/nitrogen, ammonia/nitrogen, etc. can assist in relieving stress and filling pinholes.

In keeping with additional aspects of the present invention, a variety of advantageous capacitor constructions can result from the above described methods. In one aspect, a capacitor construction includes an insulation layer over a substrate, the substrate including an electronic device. A $Si_3N_4$ barrier layer can be over the substrate and retard movement of $V_t$ shift inducing material into the electronic device. An opening can be at least into the insulation layer and an inner capacitor electrode can be at least within the opening. The inner capacitor electrode can comprise silicon. A capacitor dielectric layer can be at least within the opening and over the inner capacitor electrode. An outer capacitor electrode can be over the dielectric layer. In the capacitor construction, the barrier layer can be over the insulation layer. Alternatively, the barrier layer can be under an inner surface of the insulation layer and over the substrate. Further, the barrier layer can be under an inner surface of the insulation layer and over an outer surface of another insulation layer. The various capacitor constructions described above can be comprised by a semiconductor die.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor forming method comprising:
    forming an insulation layer over a substrate, the substrate including an electronic device;
    forming an insulative barrier layer to threshold voltage ($V_t$) shift inducing material over the substrate;
    forming an opening at least into the insulation layer;
    forming a high K capacitor dielectric layer at least within the opening; and
    providing $V_t$ shift inducing material over the barrier layer, the barrier layer retarding movement of the $V_t$ shift inducing material into the electronic device.

2. The method of claim 1 wherein the barrier layer is formed over the insulation layer.

3. The method of claim 1 wherein the barrier layer comprises a silicon nitride.

4. The method of claim 1 wherein the barrier layer consists essentially of a globally planar barrier layer.

5. The method of claim 1 wherein the forming an opening further comprises forming a congruent opening through the barrier layer.

6. The method of claim 1 wherein the opening is formed completely through the insulation layer.

7. The method of claim 1 wherein the dielectric layer comprises a tantalum oxide.

8. The method of claim 1 wherein the providing $V_t$ shift material comprises providing at least one impurity comprising layer over the barrier layer.

9. The method of claim 1 wherein the providing $V_t$ shift inducing material comprises annealing the dielectric layer.

10. The method of claim 9 wherein the annealing comprises oxide annealing.

11. The method of claim 9 wherein the annealing comprises heating the dielectric to at least about 600° C. in the presence of a nitrogen-containing oxide provided at a partial pressure of at least about 200 milliTorr.

12. The method of claim 1 wherein the $V_t$ shift inducing material comprises $N_2O$.

13. The method of claim 1 wherein the electronic device comprises a transistor.

14. The method of claim 1 wherein the substrate comprises a bulk semiconductor wafer.

15. The method of claim 1 further comprising forming a capacitor electrode at least within the opening before forming the dielectric layer.

16. A capacitor forming method comprising:
    forming an insulation layer over a substrate, the substrate including an electronic device;
    forming an insulative barrier layer to $V_t$ shift inducing material over the insulation layer;
    forming an opening through the barrier layer and into the insulation layer;
    forming a high K capacitor dielectric layer at least within the opening; and
    providing $V_t$ shift inducing material over the barrier layer, the barrier layer retarding movement of the $V_t$ shift inducing material into the electronic device.

17. The method of claim 16 wherein the barrier layer comprises $Si_3N_4$.

18. The method of claim 16 wherein the barrier layer consists essentially of a globally planar barrier layer.

19. The method of claim 16 wherein the dielectric layer comprises $Ta_2O_5$.

20. The method of claim 16 wherein the providing $V_t$ shift inducing material comprises oxide annealing the dielectric layer and the $V_t$ shift inducing material comprises $N_2O$.

21. The method of claim 16 further comprising forming a capacitor electrode at least within the opening before forming the dielectric layer.

22. A capacitor forming method comprising:
forming a barrier layer to $V_t$ shift inducing material over a substrate, the substrate including an electronic device;
forming an insulation layer over the barrier layer;
forming an opening into at least the insulation layer;
forming a high K capacitor dielectric layer at least within the opening; and
providing $V_t$ shift inducing material over the barrier layer, the barrier layer retarding movement of the $V_t$ shift inducing material into the electronic device.

23. The method of claim 22 wherein the barrier layer comprises $Si_3N_4$.

24. The method of claim 22 wherein the barrier layer consists essentially of a globally planar barrier layer.

25. The method of claim 22 wherein the opening is formed completely through the insulation layer and the barrier layer.

26. The method of claim 22 wherein the dielectric layer comprises $Ta_2O_5$.

27. The method of claim 22 wherein the providing $V_t$ shift inducing material comprises oxide annealing the dielectric layer and the $V_t$ shift inducing material comprises $N_2O$.

28. The method of claim 22 further comprising forming a capacitor electrode at least within the opening before forming the dielectric layer.

29. A capacitor forming method comprising:
forming a first insulation layer over a substrate, the substrate including an electronic device;
forming a barrier layer to $V_t$ shift inducing material over the first insulation layer;
forming a second insulation layer over the barrier layer;
forming an opening into at least the second insulation layer;
forming a high K capacitor dielectric layer at least within the opening; and
providing $V_t$ shift inducing material over the barrier layer, the barrier layer retarding movement of the $V_t$ shift inducing material into the electronic device.

30. The method of claim 29 wherein the barrier layer comprises $Si_3N_4$.

31. The method of claim 29 wherein the barrier layer consists essentially of a globally planar barrier layer.

32. The method of claim 29 wherein the opening is formed through the second insulation layer and barrier layer and into the first insulation layer.

33. The method of claim 29 wherein the dielectric layer comprises $Ta_2O_5$.

34. The method of claim 29 wherein the providing $V_t$ shift inducing material comprises oxide annealing the dielectric layer and the $V_t$ shift inducing material comprises $N_2O$.

35. The method of claim 29 further comprising forming a capacitor electrode at least within the opening before forming the dielectric layer.

36. A capacitor forming method comprising:
forming an insulation layer over a substrate, the substrate including an electronic device;
forming an opening into the insulation layer, the opening having a sidewall;
forming a capacitor electrode at least within the opening and over the sidewall;
after forming the capacitor electrode, forming a barrier layer to $V_t$ shift inducing material at least over all of the insulation layer;
after forming the barrier layer, forming a high K capacitor dielectric layer at least over the capacitor electrode; and
providing $V_t$ shift inducing material over the barrier layer, the barrier layer retarding movement of the $V_t$ shift inducing material into the electronic device.

37. The method of claim 36 wherein the forming the barrier layer comprises chemical vapor depositing at a step coverage of less than about 25%.

38. The method of claim 37 wherein the barrier layer has a thickness over the sidewall of from about 0 to about 300 Angstroms.

39. The method of claim 36 wherein the barrier layer comprises $Si_3N_4$.

40. The method of claim 36 wherein the barrier layer consists essentially of a globally planar barrier layer.

41. The method of claim 36 wherein the dielectric layer comprises $Ta_2O_5$.

42. The method of claim 36 wherein the providing $V_t$ shift inducing material comprises oxide annealing the dielectric layer and the $V_t$ shift inducing material comprises $N_2O$.

43. A capacitor forming method comprising:
forming an insulation layer over a substrate, the substrate including an electronic device;
forming an opening into the insulation layer, the opening having a sidewall;
forming a capacitor electrode at least within the opening and over the sidewall;
forming a high K capacitor dielectric layer at least over the capacitor electrode;
after forming the high K capacitor dielectric layer, forming a barrier layer to $V_t$ shift inducing material at least over all of the insulation layer; and
providing $V_t$ shift inducing material over the barrier layer, the barrier layer retarding movement of the $V_t$ shift inducing material into the electronic device.

44. The method of claim 43 wherein the dielectric layer comprises $Ta_2O_5$.

45. The method of claim 43 wherein the forming the barrier layer comprises chemical vapor depositing at a step coverage of less than about 25%.

46. The method of claim 45 wherein the barrier layer has a thickness over the sidewall of from about 0 to about 300 Angstroms.

47. The method of claim 43 wherein the barrier layer comprises $Si_3N_4$.

48. The method of claim 43 wherein the barrier layer consists essentially of a globally planar barrier layer.

49. The method of claim 43 wherein the providing $V_t$ shift inducing material comprises oxide annealing the dielectric layer and the $V_t$ shift inducing material comprises $N_2O$.

50. The method of claim 43 wherein the providing $V_t$ shift inducing material comprises annealing the dielectric layer and the forming the barrier layer occurs before the annealing.

51. The method of claim 1 wherein the barrier layer is formed on the insulation layer.

52. The method of claim 1 further comprising providing $V_t$ shift inducing material over the insulation layer.

53. The method of claim 16 wherein the barrier layer is formed on the insulation layer.

54. The method of claim 22 wherein the barrier layer is formed on the substrate.

55. The method of claim 22 further comprising providing $V_t$ shift inducing material over the insulation layer.

56. The method of claim 29 wherein the barrier layer is formed on the first insulation layer.

57. The method of claim 36 wherein the barrier layer is formed on the insulation layer.

58. The method of claim 43 wherein the barrier layer is formed on the insulation layer.

59. A capacitor forming method comprising:

forming an insulation layer over a substrate, the substrate including an electronic device;

forming a globally planar barrier layer to threshold voltage ($V_t$) shift inducing material over the substrate;

forming an opening at least into the insulation layer;

forming a high K capacitor dielectric layer at least within the opening; and providing $V_t$ shift inducing material over the barrier layer, the barrier layer retarding movement of the $V_t$ shift inducing material into the electronic device.

60. A capacitor forming method comprising:

forming an insulation layer over a substrate, the substrate including an electronic device having an elevational height;

forming a barrier layer to threshold voltage ($V_t$) shift inducing material over the substrate, all of the barrier layer being above the elevational height of the electronic device;

forming an opening at least into the insulation layer;

forming a high K capacitor dielectric layer at least within the opening; and providing $V_t$ shift inducing material over the barrier layer, the barrier layer retarding movement of the $V_t$ shift inducing material into the electronic device.

61. A capacitor forming method comprising:

forming an insulation layer over a substrate, the substrate including an electronic device;

forming a globally planar barrier layer to $V_t$ shift inducing material over the insulation layer;

forming an opening through the barrier layer and into the insulation layer;

forming a high K capacitor dielectric layer at least within the opening; and providing $V_t$ shift inducing material over the barrier layer, the barrier layer retarding movement of the $V_t$ shift inducing material into the electronic device.

62. A capacitor forming method comprising:

forming an insulation layer over a substrate, the substrate including an electronic device having an elevational height;

forming a barrier layer to $V_t$ shift inducing material over the insulation layer, all of the barrier layer being above the elevational height of the electronic device;

forming an opening through the barrier layer and into the insulation layer;

forming a high K capacitor dielectric layer at least within the opening; and providing $V_t$ shift inducing material over the barrier layer, the barrier layer retarding movement of the $V_t$ shift inducing material into the electronic device.

63. A capacitor forming method comprising:

forming an insulation layer over a substrate, the substrate including an electronic device;

forming an opening into the insulation layer, the opening having a sidewall;

forming a capacitor electrode at least within the opening and over the sidewall;

after forming the capacitor electrode, forming a globally planar barrier layer to $V_t$ shift inducing material at least over the insulation layer;

after forming the barrier layer, forming a high K capacitor dielectric layer at least over the capacitor electrode; and providing $V_t$ shift inducing material over the barrier layer, the barrier layer retarding movement of the $V_t$ shift inducing material into the electronic device.

64. A capacitor forming method comprising:

forming an insulation layer over a substrate, the substrate including an electronic device;

forming an opening into the insulation layer, the opening having a sidewall;

forming a capacitor electrode at least within the opening and over the sidewall;

forming a high K capacitor dielectric layer at least over the capacitor electrode;

after forming the high K capacitor dielectric layer, forming a globally planar barrier layer to $V_t$ shift inducing material at least over the insulation layer; and providing $V_t$ shift inducing material over the barrier layer, the barrier layer retarding movement of the $V_t$ shift inducing material into the electronic device.

* * * * *

UNITED STATES PATENT AND TRADEMARK OFFICE
CERTIFICATE OF CORRECTION

PATENT NO. : 6,911,371 B2  
APPLICATION NO. : 09/879335  
DATED : June 28, 2005  
INVENTOR(S) : Vishnu K. Agarwal et al.

Page 1 of 2

It is certified that error appears in the above-identified patent and that said Letters Patent is hereby corrected as shown below:

Title page Item (75) Inventors
  Add: Kunal R. Parekh, Boise, ID (US); and
       Randhir P.S. Thakur, San Jose, CA (India)

Title page Item (56) References cited add the following patents to the list of U.S. Patent Documents:

| | | | |
|---|---|---|---|
| 5,796,166 | 8/1998 | Agnello | 257/751 |
| 5,699,291 | 12/1997 | Tsunemine | 438/240 |
| 5,608,249 | 3/1997 | Gonzalez | 257/306 |
| 6,165,833 | 12/2000 | Parekh et al | 438/240 |

Related Patent Data, column 1, line 12
  Replace "a continuation application of U.S. Ser. No. 08/944,054"
  With --a continuation application of U.S. Ser. No. 08/994,054--

Column 1, line 35
  Replace "A shift threshold voltage ($V_t$)"
  With --A shift in threshold voltage ($V_t$)--

Column 4, line 13
  Replace "being NO—."
  With --being NO-.--

Column 4, line 19
  Replace "particularly NO—. Diffusion of impurities and other"
  With --particularly NO-. Diffusion of impurities and other--

Column 8, line 4
  Replace "One potential advantage of wafer construction and wafer"
  With --One potential advantage of wafer 50 construction and wafer--

Column 7, line 63
  Replace "FIG. 13 shows wafer construction after"
  With --FIG. 13 shows wafer construction 50 after--

UNITED STATES PATENT AND TRADEMARK OFFICE
CERTIFICATE OF CORRECTION

PATENT NO.       : 6,911,371 B2
APPLICATION NO.  : 09/879335
DATED            : June 28, 2005
INVENTOR(S)      : Vishnu K. Agarwal et al.

It is certified that error appears in the above-identified patent and that said Letters Patent is hereby corrected as shown below:

Column 7, line 59
　Replace "FIG. 12 shows a wafer construction including wafer"
　With --FIG. 12 shows a wafer construction 50 including wafer--

Signed and Sealed this

Fifth Day of February, 2008

JON W. DUDAS
*Director of the United States Patent and Trademark Office*